US006381684B1

(12) United States Patent
Hronik et al.

(10) Patent No.: US 6,381,684 B1
(45) Date of Patent: Apr. 30, 2002

(54) QUAD DATA RATE RAM

(75) Inventors: Stanley A. Hronik, Sunnyvale; Mark W. Baumann, Campbell, both of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/300,758

(22) Filed: Apr. 26, 1999

(51) Int. Cl.[7] .............................................. G06F 12/00
(52) U.S. Cl. .................. 711/167; 711/168; 365/189.04; 365/230.03; 365/230.04; 365/230.05; 365/233
(58) Field of Search ................................ 711/104, 100, 711/167, 168; 365/189.04, 230.05, 233, 230.03, 230.04

(56) References Cited

U.S. PATENT DOCUMENTS

| | | | |
|---|---|---|---|
| 4,882,709 A | 11/1989 | Wyland | 365/189.02 |
| 5,126,975 A | 6/1992 | Handy et al. | 365/230.01 |
| 5,513,327 A | 4/1996 | Farmwald et al. | 395/309 |
| 5,515,325 A | 5/1996 | Wada | 365/189.01 |
| 5,526,320 A | 6/1996 | Zagar et al. | 365/233.5 |
| 5,546,344 A | 8/1996 | Fawcett | 365/189.05 |
| 5,568,430 A | 10/1996 | Ting | 365/189.05 |
| 5,577,236 A | 11/1996 | Johnson et al. | 395/551 |
| 5,617,362 A | 4/1997 | Mori et al. | 365/189.05 |
| 5,644,729 A | 7/1997 | Amini et al. | 395/250 |
| 5,652,724 A | 7/1997 | Manning | 365/189.05 |
| 5,659,696 A | 8/1997 | Amini et al. | 395/412 |
| 5,663,901 A | 9/1997 | Wallace et al. | 365/52 |
| 5,673,398 A * | 9/1997 | Takeda | 710/105 |
| 5,675,549 A | 10/1997 | Ong et al. | 365/233.5 |
| 5,699,317 A | 12/1997 | Sartore et al. | 365/230.06 |
| 5,787,489 A | 7/1998 | Pawlowski | 711/169 |
| 5,828,606 A | 10/1998 | Mick | 365/189.05 |
| 5,838,631 A | 11/1998 | Mick | 365/233 |
| 5,841,732 A | 11/1998 | Mick | 365/233 |
| 5,875,151 A | 2/1999 | Mick | 365/233 |
| 5,915,105 A | 6/1999 | Farmwald et al. | 395/309 |
| 6,085,300 A * | 7/2000 | Sunaga et al. | 711/168 |

OTHER PUBLICATIONS

Gibson, Glenn A., *Computer Systems—Concepts and Design,* Prentice Hall, Inc., Englewood Cliffs, New Jersey, 1991, pp. 366–369 and 452–493.
Prince, Betty, *Semiconductor Memories,* Second Edition, (John Wiley & Sons ed., 1991) (1983) pp. 467–472.
"64K×32, 3.3V Synchronous SRAM With Pipelined Outputs and Interleaved/Linear Burst Counter, Preliminary IDT71V632," Integrated Device Technology, Inc., Product Information, Mar. 1997, 14 pages.
"64K×32, 3.3V Synchronous SRAM With Flow–Through Outputs–Preliminary IDT71V633," Integrated Device Technology, Inc., Product Information, Apr. 1997, 15 pages.

* cited by examiner

*Primary Examiner*—Do Hyun Yoo
*Assistant Examiner*—Yamir Ehcarnacion
(74) *Attorney, Agent, or Firm*—Skjerven Morrill MacPherson LLP

(57) ABSTRACT

A quad data rate RAM (100) in accordance with the invention is a burst synchronous RAM with separate data buses (Data-In, Data-Out) for read and write data. Data can be transferred on both buses and on both the rising and the falling edge of the clock (CLK). Operating at the maximum throughput, four data items are transferred per clock cycle. In one embodiment, data is written to or read from the RAM in bursts of four data items. The RAM includes four independent internal RAM blocks (44–47). in a write burst, (i) a write address, (ii) control signal(s), and (iii) four write data items are sequentially presented to the respective four internal RAM blocks at the respective four clock edges of two consecutive clock cycles. A read burst is carried out similar to a write burst except that there is a one clock cycle latency between the four read data items and the burst address.

44 Claims, 5 Drawing Sheets

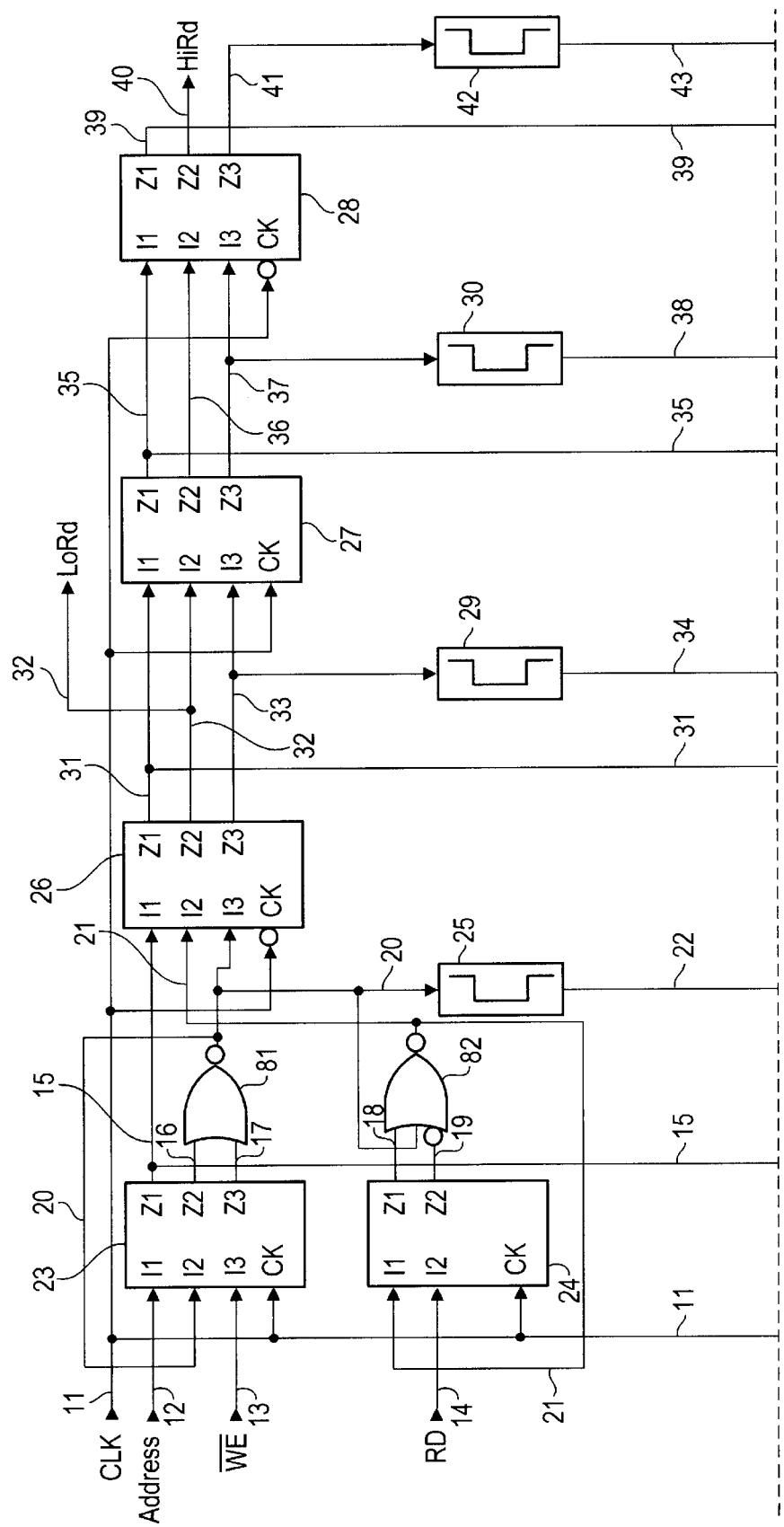

QUAD DATA RATE RAM

BACKGROUND OF THE INVENTION

1. Field of the Invention

The present invention relates to memory circuits, and more particularly to a synchronous random access memory (RAM) capable of transferring four data items per clock cycle.

2. Description of the Related Art

Conventional synchronous RAMs have a single data bus for transfer of data, and thus transfer either a read data item or a write data item in every clock cycle. Dual data rate RAMs increase the rate of data transfer to two data items per clock cycle by transferring data on both the rising and falling clock edges. This improves system performance by doubling the data bandwidth without increasing the clock frequency.

An example of a dual data rate RAM is the late-write synchronous static RAM known as Claymore or MSUG-2 developed by a private consortium known as the Motorola Semiconductor Users Group (MSUG). This device was designed for a high performance workstation level 2 cache operating in a point-to-point environment with data rates in excess of 500 MHz. Because the Claymore is a late write RAM with a single data bus, the address and data buses remain idle for one clock cycle during bus turn around (i.e., when a read cycle is followed by a write cycle or vice versa). This results in reduced data bandwidth.

There is a need for a synchronous RAM with higher data bandwidth.

SUMMARY OF THE INVENTION

In accordance with the invention, a synchronous memory circuit includes an address bus for receiving an address, a data-out bus for providing a read data item retrieved from the memory circuit, and a data-in bus for receiving a write data item to be written to the memory circuit, wherein in a clock cycle two write data items are capable of being sequentially transferred into the memory circuit via the data-in bus and two read data items are capable of being sequentially transferred out from the memory circuit via the data-out bus.

In one embodiment, the memory circuit further includes at least four memory blocks, wherein in a clock cycle two read data items are capable of being sequentially read from two of the four memory blocks and two write data items are capable of being sequentially written to the remaining two of the four memory blocks.

In another embodiment, the two read data items are two of at least four read data items sequentially read from at least four respective memory blocks in a read burst operation, and the two write data items are two of at least four write data items sequentially written to at least four respective memory blocks in a write burst operation.

In yet another embodiment, the memory circuit further includes a selection circuit having a control input terminal for receiving a clock signal, wherein in a read burst operation the selection circuit sequentially transfers each of the four read data items to the data-out bus in two consecutive clock cycles.

In another embodiment, the selection circuit includes: a multiplexer having a first input terminal for receiving the clock, a second input terminal for receiving a select signal, and at least four input buses each receiving a respective one of the four read data items; and a tri-state output buffer having an input bus coupled to an output bus of the multiplexer, an output bus connected to the data-out bus, and a control input terminal for receiving a tri-state signal, wherein the output buffer is enabled only during a valid read burst operation.

In another embodiment, the memory circuit further includes: at least four clocked input registers for sequentially providing a burst address received at the address bus and at least one read/write control signal received at an input terminal of the memory circuit to respective four of the at least four memory blocks in two consecutive clock cycles; and at least four pulse generators each coupled to a respective one of the at least four memory blocks, wherein in response to the control signal indicating a write burst operation each pulse generator in turn provides a pulse to a corresponding memory for writing the memory block.

In another embodiment, the memory circuit further includes at least two clocked output registers for receiving a burst of at least four write data items sequentially provided at the data-in bus, and providing each of the four write data items to a respective one of the at least four memory blocks, wherein in response to the pulse provided at each memory block the four write data items are sequentially written to respective four of the at least four memory blocks in two consecutive clock cycles.

In another embodiment, the memory circuit is a dynamic random access memory (DRAM) or a static random access memory (SRAM).

In accordance with the invention a method of accessing a memory circuit includes: (A) initiating a write burst operation to write at least four write data items sequentially to the memory circuit in two consecutive clock cycles, and (B) initiating a read burst operation to read at least four read data items sequentially from the memory circuit in two consecutive clock cycles, wherein the read burst operation and the write burst operation overlap such that in a clock cycle two read data items are sequentially transferred out from the memory circuit and two write data items are sequentially transferred into the memory circuit.

In another embodiment, act (A) further includes: (C) providing an address to the memory circuit, the address representing a write burst address, and (D) asserting a write control signal indicating a write operation. And, act (B) further includes: (E) providing an address to the memory circuit, the address representing a read burst address, and (F) asserting a read control signal indicating a read operation.

In another embodiment, if a second write burst operation is initiated immediately after a first write burst operation the second write burst operation is suppressed while the first write burst operation is carried to completion, and if a second read burst operation is initiated immediately after a first read burst operation the second read burst operation is suppressed while the first read burst operation is carried to completion.

In another embodiment, the method further includes: (G) continuously initiating write burst operations or continuously initiating read burst operations by holding a read/write control signal in the corresponding state while supplying a new addresses for each burst operation.

BRIEF DESCRIPTION OF THE DRAWINGS

The present invention may be better understood, and its numerous objects, features, and advantages made apparent to those skilled in the art by referencing the accompanying drawings.

FIGS. 1, 1a, and 1b are block diagram of a preferred embodiment of a quad data rate RAM in accordance with the invention.

FIGS. 2, 2a, and 2b are a sample timing diagram showing the waveforms for some signals in the memory of FIG. 1.

The use of the same reference symbols in the drawings indicates similar or identical items.

DESCRIPTION OF THE PREFERRED EMBODIMENTS

Figure 1B:
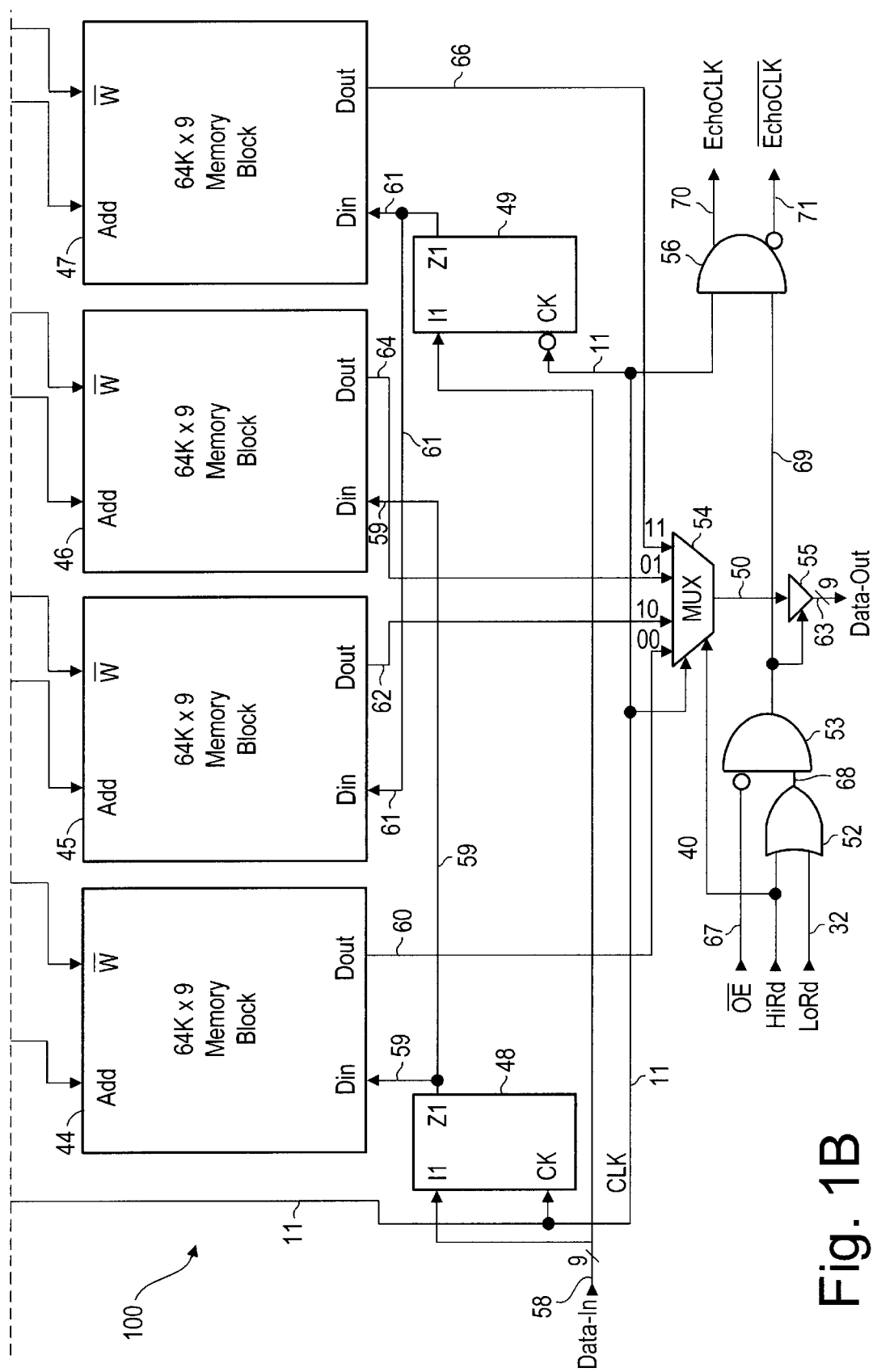

FIG. 1 is a block diagram of a quad data rate integrated RAM 100. RAM 100 is a burst synchronous RAM with separate data buses 63, 58 for read and write operations. Data can be transferred on both buses simultaneously, and on both the rising and the falling edges of the clock CLK. Operating at the maximum throughput, four data items are thus transferred per clock cycle, achieving a data transfer rate four times that of conventional RAMs, and twice that of dual data rate RAMs.

RAM 100 has an address bus 12 for receiving an address, a data-in bus 58 for transferring write data, a data-out bus 63 for transferring read data, three input terminals 13, 14, and 67 for receiving the respective $\overline{WE}$, RD, and $\overline{OE}$ control signals, an input terminal 11 for receiving clock CLK; and two output terminals 70 and 71 for providing EchoCLK and $\overline{EchoCLK}$ signals, respectively.

A first clocked register 23 has: an input bus I1 connected to address bus 12, and a corresponding output bus Z1 connected to a bus 15; an input terminal I2 connected to a lead 20, and a corresponding output terminal Z2 connected to a first input terminal 16 of a two input NOR gate 81; an input terminal I3 connected to $\overline{WE}$ terminal 13, and a corresponding output terminal Z3 connected to a second input terminal 17 of NOR gate 81; and a CK input terminal connected to CLK terminal 11. NOR gate 81 has an output terminal connected to lead 20.

A second clocked register 24 has: an input terminal I1 connected to a lead 21, and a corresponding output terminal Z1 connected to a first input terminal 18 of a three input NOR gate 82; an input terminal I2 connected to RD terminal 14, and a corresponding output terminal Z2 connected to an inverting second input terminal 19 of NOR gate 82; and a CK input terminal connected to CLK terminal 11. NOR gate 82 has a third input terminal connected to the output terminal of NOR gate 81 at lead 20, and has an output terminal connected to lead 21.

Each of three serially connected clocked registers 26, 27, and 28 has: an input bus I1, and a corresponding output bus Z1; and input terminals I2 and I3, and corresponding output terminals Z2 and Z3. Inputs I1, I2, and I3 of register 26 are connected respectively to bus 15, lead 21, and lead 20. Outputs Z1, Z2, and Z3 of register 26 are connected to the respective inputs I1, I2, and I3 of register 27 at bus 31, LoRd output terminal 32, and lead 33 respectively. Outputs Z1, Z2, and Z3 of register 27 are connected to the respective inputs I1, I2, and I3 of register 28 at bus 35, lead 36, and lead 37 respectively. Outputs Z1, Z2, and Z3 of register 28 are connected to bus 39, HiRd output terminal 40, and lead 41 respectively. Register 27 has a CK input terminal connected to CLK terminal 11, and each of registers 26 and 28 has an inverting CK input terminal connected to CLK terminal 11.

Figure 3:
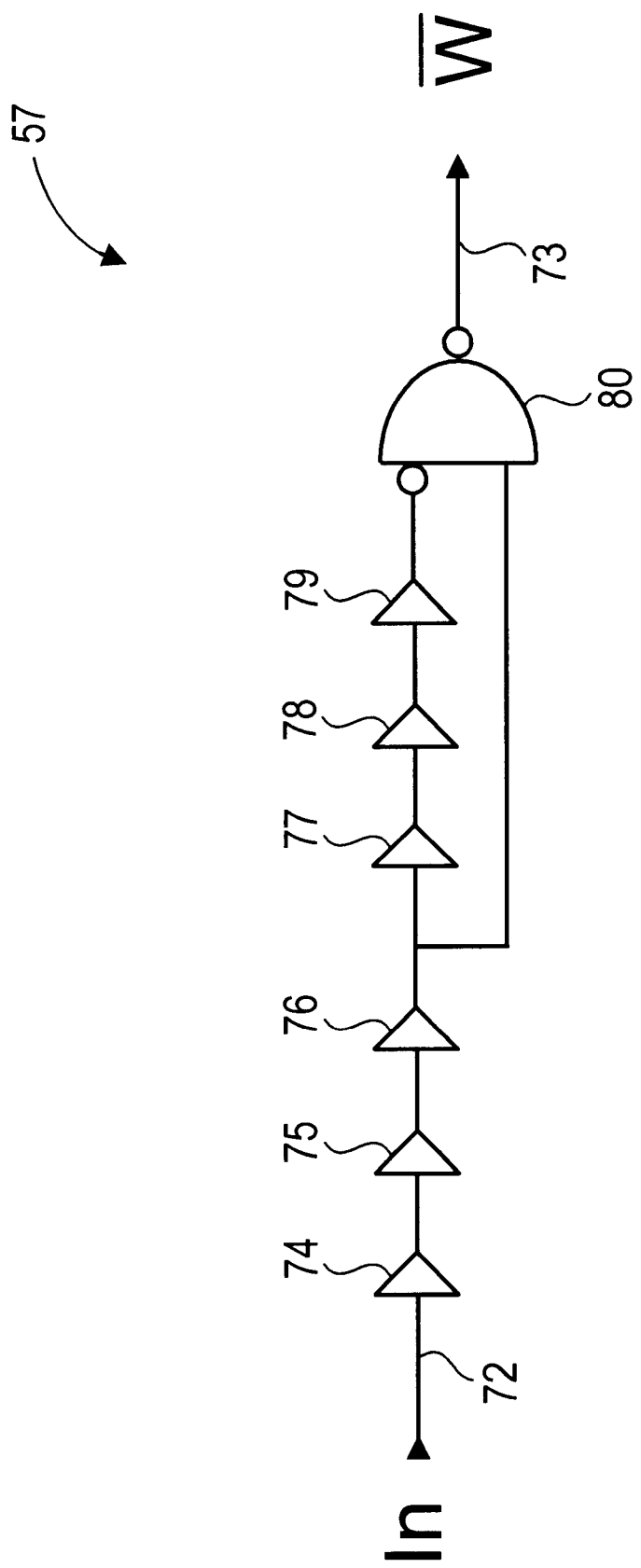
FIG. 3 is a circuit diagram of an example of a pulse generator circuit which can be used as pulse generators 25, 29, 30 and 42 in FIG. 2.

Each of four identical pulse generator blocks 25, 29, 30, and 42 has: an input terminal respectively connected to leads 20, 33, 37, and 41; and an output terminal respectively connected to leads 22, 34, 38, and 43. An example of a pulse generator circuit 57 which can be used as pulse generators 25, 29, 30 and 42 is shown in FIG. 3. Circuit 57 includes buffers 74, 75, 76, 77, 78, and 79 serially connected between an input terminal 72 (marked as "In") and an inverting input terminal of a two input NAND gate 80. NAND gate 80 has a second input terminal connected to the lead between buffers 76 and 77, and an output terminal 73 (marked as "$\overline{W}$").

Each of four identical memory blocks 44, 45, 46, and 47 has: an input bus Add connected to the respective buses 15, 31, 35, and 39 for receiving an address; an input terminal $\overline{W}$ connected to the respective leads 22, 34, 38, and 43 for receiving a control signal; input bus Din connected to the respective buses 59, 61, 59, and 61 for receiving write data; and an output bus Dout connected to the respective buses 60, 62, 64, and 66 for providing read data.

Each of two clocked registers 48 and 49 has an input bus I1 connected to the data-in bus 58 for receiving write data and an output bus Z1. Output Z1 of register 48 is connected to bus 59 which is connected to the data input buses Din of memory blocks 44, 46. Output Z1 of register 49 is connected to bus 61 which is connected to the data input buses Din of memory blocks 45, 47. Registers 48 and 49 have respective CK and inverting CK input terminals both connected to CLK terminal 11.

Registers 23, 24, 27, and 48 are positive clock edge sensitive, and registers 26, 28, and 49 are negative clock edge sensitive. On a respective clock edge, each register latches its inputs and drives them on the respective outputs.

A multiplexer 54 has: four input buses each connected to one of Dout buses 60, 62, 64, and 66 of respective memory blocks 44, 45, 46, 47; two select input terminals connected respectively to HiRd terminal 40 and CLK terminal 11; and an output bus connected to an input bus of a tri-state output buffer 55 at bus 50. Mux 54 selects the data on one of its four input buses for transfer to its output bus in accordance with the following table:

TABLE 1

| HiRd | CLK | Output (bus 50) |
|------|-----|-----------------|
| 0    | 0   | Dout 60         |
| 0    | 0   | Dout 62         |
| 1    | 0   | Dout 64         |
| 1    | 1   | Dout 66         |

Tri-state output buffer 55 has an input terminal connected to a lead 69 for receiving a tri-state signal, and an output terminal connected to data-out bus 63. A two input OR gate 52 has a first input terminal connected to HiRd terminal 40, a second input terminal connected to LoRd terminal 32, and an output terminal connected to a first input terminal of a two input AND gate 53 at lead 68. AND gate 53 has an inverting second input terminal connected to $\overline{OE}$ input terminal 67, and an output terminal connected to lead 69. A two input, two output AND gate 56 has its input terminals connected respectively to CLK terminal 11 and lead 69, and its output terminals 70 and 71 provide the respective EchoCLK and $\overline{EchoCLK}$ signals.

Each of memory blocks 44–47 includes a 64K×9 (576K bits) memory array (not shown). Thus, RAM 100 has a memory capacity of over 2 megabits with a nine bit wide data configuration. The memory and data configuration of RAM 100 is only illustrative and not intended to be limiting. Each of memory blocks 44–47 operates similar to conventional asynchronous RAMs (i.e., when $\overline{W}$ is high, a memory location corresponding to a read address provided at the Add bus is read out to the Dout bus; and when $\overline{W}$ is low, data received at the Din bus is written to a memory location corresponding to a write address provided at the Add bus).

In some embodiments, RAM 100 is an integrated circuit or part of an integrated circuit. Terminals CLK, $\overline{WE}$, RD, and $\overline{OE}$, and buses Address, Data-in, and Data-out are external pins or are otherwise accessible to an application using the RAM. Address buses Add of memory blocks 44–47 are "internal", that is, they are not necessarily accessible to the application. Each read or write operation is a burst operation accessing four memory locations at the same address in memory blocks 44–47.

Figure 2A:
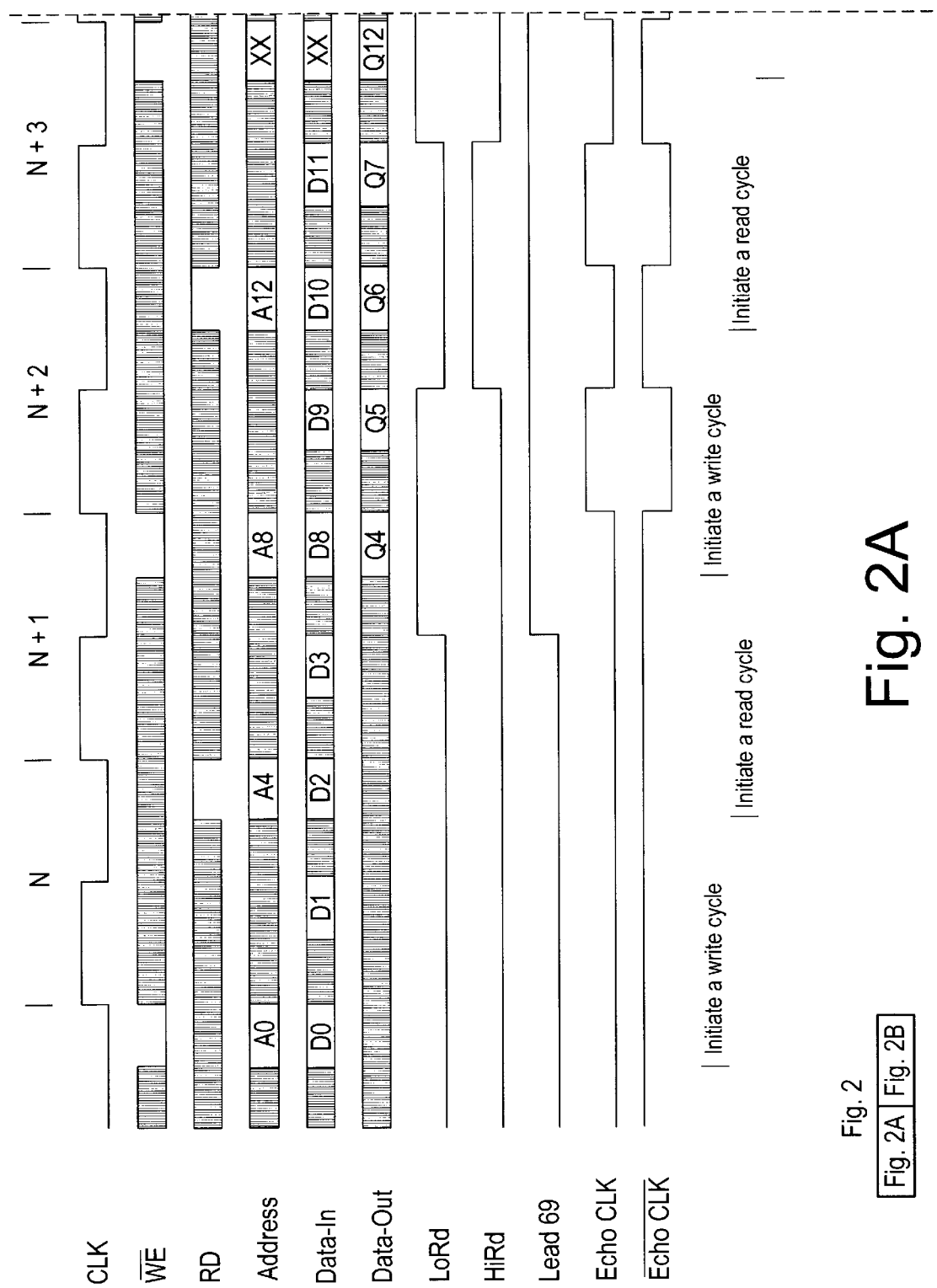
Figure 2B:
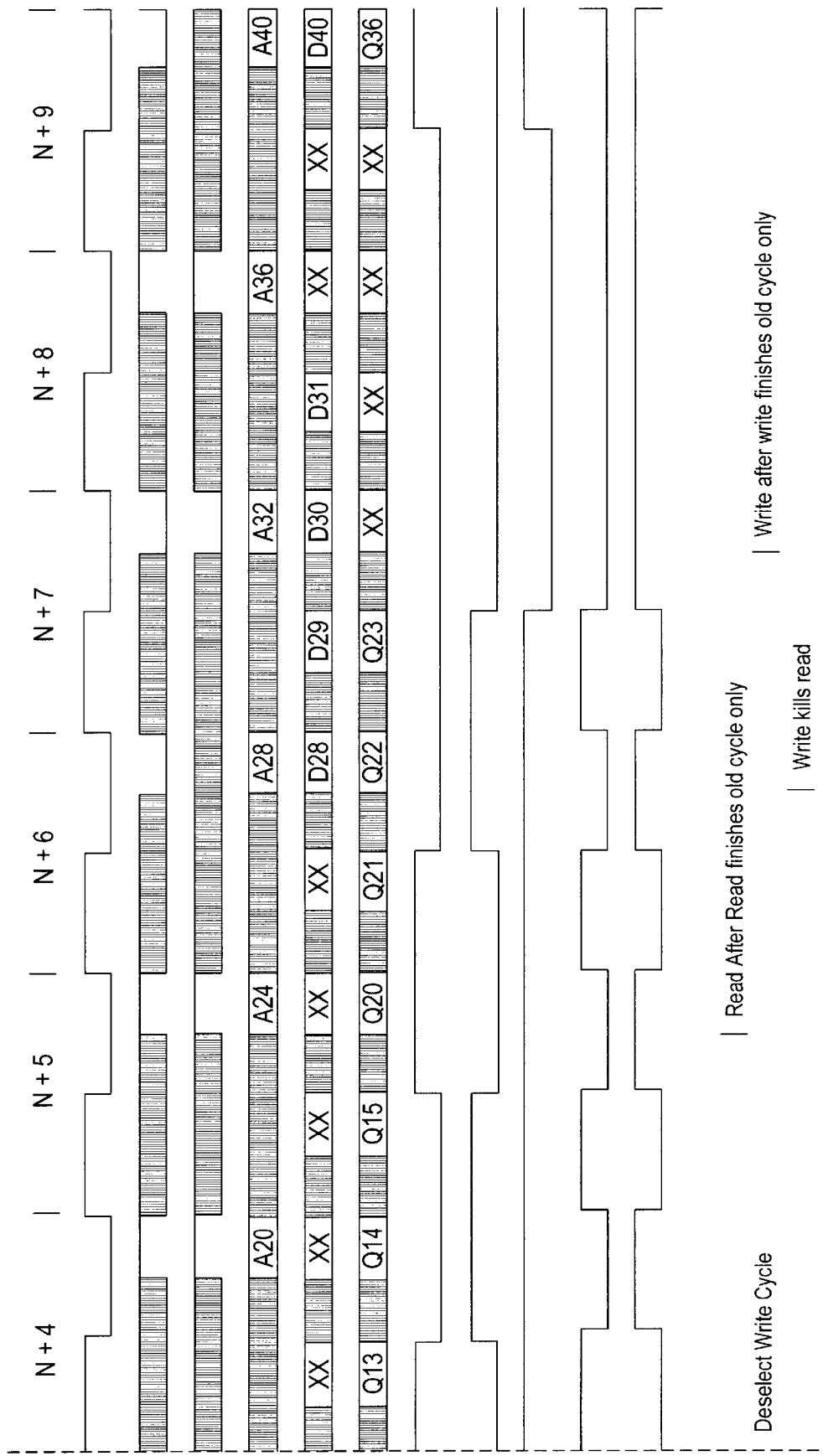

FIG. 2 shows the waveforms for inputs: CLK, $\overline{WE}$, RD, Address, and Data-in; outputs: Data-out, EchoCLK, and $\overline{EchoCLK}$; signals: LoRd, HiRd, and at lead 69. Ten clock cycles (N to N+9) are illustrated.

Data is written to or read from RAM 100 in bursts of four data items. In a write burst, four data items, for example D0, D1, D2, and D3 corresponding to external address A0 (the address at address bus 12) are sequentially written to respective memory blocks 44, 45, 46, and 47 on the respective rising and falling edges of clock cycles N and N+1. In a read burst, four data items, for example Q4, Q5, Q6, and Q7 corresponding to external address A4 are sequentially read from the respective memory blocks 44, 45, 46, and 47 on the respective rising and falling edges of clock cycles N+1 and N+2 and are sequentially provided at the data-out bus 63 prior to the respective rising and falling edges of clock cycles N+2 and N+3. Thus, there is one clock cycle of latency in a read burst (e.g., read data Q4 is available on the data-out bus one clock cycle after A4), while there is no latency in a write burst (e.g., write data D0 is provided on the data-in bus at the same time as A0).

The write burst at address A0 is initiated at the rising edge of clock cycle N by asserting a low voltage on the $\overline{WE}$ terminal 13. At the same time, register 23 transfers A0 at its input I1 to the Add input 15 of memory block 44, and register 48 transfers data D0 at its input I1 to Din input 59 of memory blocks 44 and 46. Register 23 also transfers a signal at its input I2 and the low $\overline{WE}$ signal at its input I3 to the respective input terminals 16 and 17 of NOR gate 81. Assuming there was no write burst initiated in the immediately preceding clock cycle or the write burst was initiated but suppressed, I2 is low allowing NOR gate 81 to provide a high voltage at the input of pulse generator 25 in response to the low $\overline{WE}$ signal. The pulse generator 25 provides a negative pulse at $\overline{W}$ terminal 22 of memory block 44 in response to the low to high transition at its input 20 (note that pulse generators 25, 29, 30 and 42 generate a negative pulse only in response to a low to high transition at their inputs). During the negative pulse, data D0 is written to block 44 at address A0. The duration of the negative pulse must be sufficient for the data to be written to the memory location. Note that despite D0's presence at the Din input of memory block 46, no data is written to memory block 46 since its $\overline{W}$ terminal 38 is high.

Upon the falling edge of clock cycle N, register 26 transfers A0 at its input I1 to the Add input 31 of memory block 45, and register 49 transfers D1 at its input I1 to Din input 61 of memory blocks 45 and 47. Register 26 also transfers a low signal at its input I2 to the input I2 of register 27 at lead 32, and transfers the high signal at its input I3 (which corresponds to the $\overline{WE}$ signal) to the input of pulse generator 29 and input I3 of register 27 at lead 33. The pulse generator 29 provides a negative pulse at the $\overline{W}$ input 34 of memory block 45 in response to the low to high transition at its input 33. During the negative pulse, data D1 is written to block 45 at internal address A0.

Data D2 and D3 are written to respective memory blocks 46 and 47 on the respective rising and falling edges of clock cycle N+1 in a similar manner to data D0 and D1. Initiating the A0 write burst is independent of the state of the RD signal (as indicated in FIG. 2) because upon receiving the low $\overline{WE}$ signal, NOR gate 81 disables NOR gate 82 by providing a high voltage at lead 20, thereby preventing the RD signal from propagating through NOR gate 82. However, the RD signal can not be overridden by the $\overline{WE}$ signal if the previous burst was also a write burst. This is because if two sequential write bursts are attempted (i.e., two write bursts are attempted in consecutive clock cycles), the second write burst fails. This is illustrated in FIG. 2 wherein two sequential write bursts corresponding to addresses A28 and A32 are attempted in respective clock cycles N+7 and N+8. As shown, the A28 write burst is completed while the A32 write burst is suppressed (i.e., is prevented from propagating through RAM 100). This is accomplished by either connecting the output of NOR gate 81 to input I2 of register 23 as shown in FIG. 1, or connecting the output Z3 of register 26 to input I2 of register 23.

Upon the rising edge of clock cycle N+1, while the A0 write burst is in progress, a read burst corresponding to address A4 is initiated. This overlapping of read and write bursts is made possible by having separate data buses 63, 58 for read and write data. The A4 read burst is initiated at the rising edge of clock cycle N+1 by asserting a high voltage on the RD terminal 14 (note that the state of the $\overline{WE}$ signal is irrelevant since the high voltage at input terminal 16 of NOR gate 81 keeps gate 81 disabled during this clock cycle). At the same time, register 23 transfers address A4 at its input I1 to the Add input 15 of memory block 44. The data Q4 in the memory location corresponding to address A4 is retrieved from memory block 44, and is provided at Dout bus 60. In accordance with Table 1, mux 54 transfers data Q4 at bus 60 to the input of output buffer 55 if the signals CLK and HiRd are low. Tri-state output buffer 55 provides data Q4 to data-out bus 63 when the signal at its tri-state input 69 goes high, i.e., at the falling edge of clock cycle N+1. Note that optimum speed performance can be achieved by ensuring that the data from each memory block arrives at the input bus of mux 54 prior to or at about the same time as the CLK signal selecting the input bus arrives at mux 54. If the data arrives at the mux later than the CLK signal, RAM 100 would still function properly but the time the data is available on bus 63 disadvantageously becomes less than half a clock cycle.

Upon the falling edge of clock cycle N+1, register 26 transfers A4 at its input I1 to the Add input 31 of memory block 45. The data Q5 is retrieved from memory block 45 at address A4, and is provided at Dout bus 62. In accordance with Table 1, mux 54 transfers data Q5 at bus 62 to the input of output buffer 55 given that the clock CLK is high and HiRd signal is low. Tri-state output buffer 55 provides data Q5 at data-out bus 63 when the signal at its tri-state input 69 is high. OR gate 52 causes lead 69 to be high when either the LoRd or the HiRd signal is high, provided $\overline{OE}$ is low. A high LoRd signal indicates that data is read from memory blocks 44 or 45, and a high HiRd signal indicates that data is read from memory blocks 46 or 47. The signal at Lead 69 goes high with the LoRd signal going high, and the signal at lead 69 remains high during the rest of the read burst, as shown in FIG. 2.

Data Q6 and Q7 are retrieved from respective memory blocks 46 and 47 and are provided at Datazut bus 63 after the falling edge of clock cycle N+2 and the rising edge of clock cycle N+3 respectively in a similar manner to data Q4 and Q5.

Note that the LoRd and HiRd signals reflect the state of the RD signal but with a delay: registers 24 and 26 cause the LoRd signal to go high half a clock cycle after a read burst is initiated, and registers 24, 26, 27, and 28 cause the HiRd signal to go high one and a half clock cycles after the initiation of the read burst. The LoRd and HiRd signals are used to ensure that buffer 55 is enabled only during read bursts. This allows the initiation of a read burst without requiring external tracking of the progress of the burst. The LoRd and HiRd signals do not respond to the RD signal in the second of two sequential read bursts because of the feed back loop of NOR gate 82, as described next. The LoRd and/or HiRd signals are active only if and whenever valid read data is active on bus 50.

Similar to write bursts, when two sequential read bursts are attempted (i.e., read bursts are initiated in consecutive clock cycles), the second read burst is suppressed. This is illustrated in FIG. 2 wherein two sequential read bursts corresponding to addresses A20 and A24 are attempted in respective clock cycles N+5 and N+6. As shown, the A20 read burst is completed while the A24 read burst is suppressed (i.e., is prevented from propagating through RAM 100). This is accomplished by either connecting the output of NOR gate 82 to input I1 of register 24 (as shown in FIG. 1) or connecting output Z2 of register 26 to input I1 of register 24.

Transfer of data can continue with the initiation of alternating read and write bursts on every rising edge of the clock, as described above. Two data items are thus transferred on each of the two data buses during each clock cycle (e.g., data D9, D10, Q5 and Q6 are transferred during the N+2 cycle), achieving a quad data transfer rate per clock cycle. In cases of sequential reads or sequential writes, the unused data-in or data-out bus is idle, and thus two data items rather than four are transferred per clock cycle.

Once a burst is initiated, it progresses to completion regardless of whether new valid or conflicting bursts are initiated. Thus, control signals $\overline{WE}$ and RD and the address need not be maintained throughout the burst. Also, sequential read or sequential write bursts can be carried out by holding the $\overline{WE}$ and RD control signals active while supplying only the new burst address at the proper time in the burst cycles.

The burst length can be made greater than four by providing a corresponding greater number of internal memory blocks. As with the length of four, longer bursts are carried out as the same internal address is passed from one memory block to the next on each edge of the clock. A longer burst causes the data buses data-in and data-out to be occupied for more clock cycles, and allows the address bus and control signals $\overline{WE}$ and RD to be free for longer periods.

A read of a memory block is allowed to take a whole clock cycle. For example, in a read of block 44 in the A4 data burst, A4 is provided to block 44 at the start of clock cycle N+1, and the data Q4 can be read out to bus 63 any time before the end of cycle N+1, provided the set-up and holding times for the reading (target) device are satisfied. The block 45 read is also allowed to take one cycle starting at the falling edge of cycle N+1. The two reads overlap in the second half of cycle N+1.

Similarly, the writes of different blocks 44–47 overlap. Registers 48 and 49 are clocked at half the speed at which the data are provided on the data-in bus. A whole cycle is allowed to write a memory block, and one half a cycle is allowed for overlap.

Using this method, the external address is at half the toggle rate of the clock for a burst of four. If longer burst lengths are implemented, the external address could be even slower.

In applications wherein RAM 100 is accessed continuously (i.e., on every clock cycle), only one control signal is needed to indicate whether an operation is a read or a write. In such applications, $\overline{WE}$ terminal 13 and RD terminal 14 can be connected together, or alternatively RD terminal 14 can be made active at all times (e.g., by connecting the RD terminal to a power supply voltage) and the $\overline{WE}$ signal can be used to indicate whether the operation is a read or a write. Also, $\overline{WE}$ terminal 13 can be made active at all times (e.g., by connecting the $\overline{WE}$ terminal to ground) if an alternate means of identifying the burst boundaries is provided.

Clock signals EchoCLK and $\overline{EchoCLK}$ are timed to coincide with the read data availability at the data out bus 63, and are provided for being routed to a target clocked device along with the data. This eliminates potential timing skews between the clock and the data at the target device reading the RAM, and thus eliminates potential read errors at the target device. Further, the EchoCLK and $\overline{EchoCLK}$ signals are active only during read bursts (i.e., these signals change with clock CLK only when the HiRd or LoRd signals are high). This simplifies the system design by eliminating the need for a separate signal notifying the target device of the data transfer from RAM 100.

One embodiment of the EchoCLK/$\overline{EchoCLK}$ generating circuit is shown in FIG. 1. A read operation indicated by a high LoRd signal or a high HiRd signal is detected by OR gate 52, which in turn provides a high voltage on lead 69 through AND gate 53. This enables AND gate 56 so that EchoCLK reflects the state of the CLK signal received at an input terminal of gate 56. As shown in FIG. 2, lead 69 is high when either the LoRd or the HiRd signals are high, and it is only during that time that EchoCLK responds to the CLK signal. AND gate 56 should be designed to have a gate delay shorter than or equal to that of mux 54 plus output buffer 55. This ensures that EchoCLK can be used externally with a zero hold time register (not shown) to capture any data appearing on data-out bus 63. The EchoCLK/$\overline{EchoCLK}$ signals help the system achieve the maximum possible setup time on the target device, while the hold time is minimized.

The $\overline{EchoCLK}$ signal is provided to facilitate clocking of data on both the rising and the falling edges of clock CLK. The rising edge of EchoCLK can be used to clock rising edge data, and the rising edge of $\overline{EchoCLK}$ can be used to clock falling edge data. Also, EchoCLK and $\overline{EchoCLK}$ can be used differentially if the application requires it. Note that the EchoCLK and $\overline{EchoCLK}$ signals are not necessary for the proper operation of RAM 100, and merely support the external use of the RAM. Thus, the EchoCLK and $\overline{EchoCLK}$ signals and the associated circuitry may be removed if the application does not use them.

The RD and $\overline{WE}$ signals may be replaced with the more commonly known control signal CS (chip select) in combination with another signal indicating whether the operation is a read or a write. But, this requires that the CS signal be active for both write and read bursts and disabled if neither is active. The $\overline{OE}$ terminal 67 may be connected to ground if the application has no use for it, and if it is not needed for testing purposes.

The pulse generator 57 (FIG. 3) is illustrative only. However, the time delay corresponding to buffers 74, 75, and 76 must be long enough to allow the address at the Add bus and the data at the Din bus of memory blocks 44–47 to be properly set up before the write pulse is presented to the $\overline{W}$ input terminal of blocks 44–47. The delay corresponding to buffers 77, 78, and 79 determine the pulse duration. Thus, buffers 74–79 may be replaced with a suitable number of other inverting or non-inverting buffers to provide the desired time delays.

Mux 54 may be replaced by a controlled selection device, for example, a driver which is enabled at the appropriate time in the cycle.

The quad data rate RAM of the present invention is intended for but not limited to high speed read/write applications, such as network switches and routers, which receive and store data in a memory before data are transmitted (here both read and write can be carried out without interfering with each other), or graphics applications where data is loaded into the graphics memory and then fed out continuously to a video screen. If the data needs to be updated, the write can be performed without interfering with the continuous read.

The RAM 100 architecture of FIG. 1 is applicable to both static random access memories (SRAMs) and dynamic random access memories (DRAMs). Registers 23, 24, 26, 27, 28, 48, and 49 may be clocked D type flip flop registers.

Having separate buses 63, 58 for read and write data eliminates the problem of turning the data bus around (i.e., a read cycle followed by a write cycle or vice versa) commonly associated with single data bus architectures. Also, mux 54 provides register-like operation at the output but with one cycle of latency instead of the two required by registered outputs.

The invention is not limited to an integrated RAM 100, i.e., discrete components may be used to implement RAM 100.

The above description of the present invention is intended to be illustrative and not limiting. The invention is not limited to any particular circuitry or timing. The invention is not limited to the number of external address bits provided to the memory, to any signal being provided on a rising or falling edge, or to edge-sensitive circuitry. The invention includes all variations and modifications falling within the scope of the appended claims.

What is claimed is:

1. A synchronous memory circuit, comprising:
   at least four memory blocks;
   an address bus for receiving an address;
   a data-out bus for providing a read data item retrieved from the four memory blocks; and
   a data-in bus for receiving a write data item to be written to the four memory blocks;
   wherein in a clock cycle two read data items are capable of being sequentially read from two of the four memory blocks via the data-out bus and two write data items are capable of being sequentially written to the remaining two of the four memory blocks via the data-in bus.

2. The memory circuit of claim 1 wherein a read burst operation comprises reading at least two data items from respective two memory blocks so that reading one of the memory blocks overlaps with reading another one of the memory blocks.

3. The memory circuit of claim 2 wherein each of the at least two data items in the read burst operation is read in one clock cycle, and reading said one of the memory blocks overlaps with reading said other one of the memory blocks during half a clock cycle.

4. The memory circuit of claim 1 wherein a write burst operation comprises writing at least two data items to respective two memory blocks so that writing one of the memory blocks overlaps with writing another one of the memory blocks.

5. The memory circuit of claim 4 wherein each of the at least two data items in the write burst operation is written in one clock cycle, and writing said one of the memory blocks overlaps with writing said other one of the memory blocks during half a clock cycle.

6. The memory circuit of claim 1 wherein the two read data items are two of at least four read data items sequentially read from respective four of the at least four memory blocks in a read burst operation, and the two write data items are two of at least four write data items sequentially written to respective four of the at least four memory blocks in a write burst operation.

7. The memory circuit of claim 6 further comprising a selection circuit having a control input terminal for receiving a clock signal, wherein in the read burst operation the selection circuit sequentially transfers each of the four read data items to the data-out bus in two consecutive clock cycles.

8. The memory circuit of claim 7 wherein the selection circuit comprises a multiplexer having a first input terminal for receiving the clock, a second input terminal for receiving a select signal, and at least four input buses each receiving a respective one of the at least four read data items.

9. The memory circuit of claim 7 wherein the selection circuit further comprises a tri-state output buffer having an input bus coupled to an output bus of the multiplexer, an output bus connected to the data-out bus, and a control input terminal for receiving a tri-state signal, wherein the output bus provides one of the at least four read data items and the output buffer is enabled only during a valid read burst operation.

10. The memory circuit of claim 7 further comprising at least four clocked input registers for sequentially providing a burst address received at the address bus and at least one read/write control signal received at an input terminal of the memory circuit to respective four of the at least four memory blocks in two consecutive clock cycles.

11. The memory circuit of claim 7 further comprising:
    at least one control input terminal for receiving at least one control signal for indicating a read burst or a write burst operation; and
    at least four pulse generators each coupled to a respective one of the at least four memory blocks, wherein in response to the control signal indicating a write burst operation each pulse generator in turn provides a pulse to a corresponding memory block for writing the memory block.

12. The memory circuit of claim 11 wherein the pulse is a negative pulse with sufficient duration to enable a write data item to be written to a corresponding memory block.

13. The memory circuit of claim 11 further comprising at least two clocked output registers for receiving a burst of at least four write data items sequentially provided at the data-in bus, and providing each of the four write data items to a respective one of the at least four memory blocks, wherein in response to the pulse provided at each memory block the four write data items are sequentially written to respective four of the at least four memory blocks in two consecutive clock cycles.

14. The memory circuit of claim 7 further comprising:
    a first circuit for preventing a second one of two consecutive read burst operations from propagating through the memory circuit; and a second circuit for preventing a second one of two consecutive write burst operations from propagating through the memory circuit.

15. The memory circuit of claim 7 wherein if a write burst operation and a read burst operation are both initiated in a first clock cycle, the read burst operation is suppressed while the write burst operation is carried to completion unless a write burst operation was initiated in an immediately preceding clock cycle, in which case the write burst operation initiated in the first clock cycle is suppressed, the write burst operation initiated in the preceding clock cycle is carried to completion and the read burst operation is carried to completion.

16. The memory circuit of claim 7 further comprising a circuit for generating an echo clock signal from the clock signal such that the echo clock signal is active only when a read data item is provided on the data-out bus.

17. The memory circuit of claim 9 further comprising a circuit for receiving a read control input signal and generating the select signal and the tri-state signal.

18. The memory circuit of claim 10 wherein once a burst operation is initiated the address and the at least one read/write control signal need not be maintained through the burst operation.

19. The memory circuit of claim 10 wherein continuous read burst operations or continuous write burst operations are carried out by holding the at least one read/write control signal in one state while supplying a new address for each burst operation.

20. The memory circuit of claim 7 wherein the memory circuit is a dynamic random access memory (DRAM) or a static random access memory (SRAM).

21. A method of accessing a synchronous memory circuit including at least four memory blocks, comprising the acts of:
    (A) initiating a write burst operation to write at least four write data items sequentially to the memory circuit in two consecutive clock cycles; and
    (B) initiating a read burst operation to read at least four read data items sequentially from the memory circuit in two consecutive clock cycles;
    wherein the read burst operation and the write burst operation overlap such that in a clock cycle two read data items are sequentially read from two of the four memory blocks via a data-out bus and two write data items are sequentially written to the remaining two of the four memory blocks via a data-in bus.

22. The method of claim 21 wherein act (A) further comprises:
    (C) providing an address to the memory circuit, the address representing a write burst address;
    (D) asserting a write control signal indicating a write operation; and
    (E) providing a first of four sequential write data items to the memory circuit.

23. The method of claim 21 wherein act (B) further comprises:
    (F) providing an address to the memory circuit, the address representing a read burst address;
    (G) asserting a read control signal indicating a read operation.

24. The method of claim 21 wherein if a second write burst operation is initiated immediately after a first write burst operation the second write-burst operation is suppressed while the first write burst operation is carried to completion, and if a second read burst operation is initiated immediately after a first read burst operation the second read burst operation is suppressed while the first read burst operation is carried to completion.

25. The method of claim 21 further comprising:
    (H) generating an echo clock signal from a clock signal, the echo clock signal being active only when a read data item is read from the memory circuit.

26. The method of claim 21 wherein act (A) further comprises:
    (I) continuously initiating write burst operations by holding a read/write control signal in a state indicating a write operation while supplying a new addresses for each write burst operation.

27. The method of claim 21 wherein act (A) further comprises:
    (J) continuously initiating read burst operations by holding a read/write control signal in a state indicating a read operation while supplying a new addresses for each read burst operation.

28. The method of claim 21 wherein a burst operation once initiated and not suppressed is carried to completion regardless of whether new or conflicting burst operations are initiated thereafter.

29. The method of claim 22 wherein once the write burst operation is initiated the address and the write control signal need not be maintained.

30. The method of claim 23 wherein once the read burst operation is initiated the address and the read control signal need not be maintained.

31. The method of claim 21, wherein if a write burst operation and a read burst operation are both initiated in a first clock cycle, the read burst operation is suppressed while the write burst operation is carried to completion unless a write burst operation was initiated in an immediately preceding clock cycle in which case the write burst operation initiated in the first clock cycle is suppressed and the read burst operation is carried to completion.

32. A method of accessing a synchronous memory circuit, comprising:
    (A) initiating a write burst operation to write at least four write data items sequentially to the memory circuit in two consecutive clock cycles; and
    (B) initiating a read burst operation to read at least four read data items sequentially from the memory circuit in two consecutive clock cycles;
    wherein:
        the read burst operation and the write burst operation overlap such that in a clock cycle two read data items are sequentially transferred out from the memory circuit and two write data items are sequentially transferred into the memory circuit; and
        if a write burst operation and a read burst operation are both initiated in a first clock cycle, the read burst operation is suppressed while the write burst operation is carried to completion unless a write burst operation was initiated in an immediately preceding clock cycle in which case the write burst operation initiated in the first clock cycle is suppressed and the read burst operation is carried to completion.

33. A synchronous memory circuit comprising:
    an address bus for receiving a burst address, a data-in bus for receiving a write data item, a data-out bus for providing a read data item, an input terminal for receiving a clock, a first control input terminal for receiving a write control signal, and a second control input terminal for receiving a read control signal;

four asynchronous memory blocks each having a data bus Din for receiving a write data item, a data bus Dout for providing a read data item, and a read/write control input terminal;

four clocked input registers for sequentially providing the burst address and the write control signal to a respective one of the four memory blocks at each clock edge of two consecutive clock cycles;

four pulse generator circuits each coupled to a respective one of the four memory blocks, wherein in response to the write control signal indicating a write burst operation each pulse generator in turn provides a pulse at the read/write control input terminal of a respective memory block during which pulse one write data item is written to a respective memory block;

two clocked output registers for receiving a burst of four write data items sequentially provided at the data-in bus, and providing each of the four write data items to a respective Din bus of the four memory blocks, wherein in response to the pulse provided at the read/write control input terminal of each memory block the four write data items are sequentially written to respective four memory blocks in two consecutive clock cycles;

a circuit for generating a select signal and a tri-state signal in response to the read control signal indicating a read burst operation;

a multiplexer having a first input terminal for receiving the clock signal, and a second input terminal for receiving the select signal, wherein in a read burst operation the multiplexer sequentially transfers each of four read data items provided at the Dout bus of a respective one of the four memory blocks to an output bus of the multiplexer in two consecutive clock cycles; and an output tri-state buffer having an input bus coupled to the output bus of the multiplexer, an output bus connected to the data-out bus, and an input terminal for receiving the tri-state signal, wherein the output buffer is enabled only during a valid read burst operation.

34. The memory circuit of claim 33 further comprising a circuit for generating an echo clock signal from the clock signal such that the echo clock signal is active only when a read data item is provided on the data-out bus.

35. The memory circuit of claim 33 wherein the memory circuit is a dynamic random access memory (DRAM) or a static random access memory (SRAM).

36. A method for accessing a synchronous memory circuit, comprising:

in response to a write signal and a write address signal:
  writing a first write data item from a write bus to a first memory block in response to a first edge of a first clock;
  writing a second write data item from the write bus to a second memory block in response to a second edge of the first clock;
  writing a third write data item from the write bus to a third memory block in response to a first edge of a second clock;
  writing a fourth write data item from the write bus to a fourth memory block in response to a second edge of the second clock;

in response to a read signal and a read address signal:
  reading a first read data item from the first memory block in response to the first edge of the second clock;
  reading a second read data item from the second memory block in response to the second edge of the second clock.

37. The method of claim 36, wherein the writing the first write data item comprises propagating the write and the write address signals to the first memory block in response to the first edge of the first clock.

38. The method of claim 37, wherein the writing the second write data item comprises propagating the write and the write address signals to the second memory block in response to the second edge of the first clock.

39. The method of claim 36, wherein the writing the third write data item comprises propagating the write and the write address signals to the third memory block in response to the first edge of the second clock.

40. The method of claim 39, wherein the writing the fourth write data item comprises propagating the write and the write address signals to the fourth memory block in response to the second edge of the second clock.

41. The method of claim 40, wherein the reading the first read data item comprises propagating the read address signal to the first memory block in response to the first edge of the second clock.

42. The method of claim 41, wherein the reading of the second read data item comprises propagating the read address signal to the second memory block in response to the second edge of the second clock.

43. The method of claim 36, further comprising selecting an output of the memory circuit depending on states of the read signal and the second clock signal.

44. The method of claim 43, further comprising providing the output of the memory circuit depending on the state of the read signal.

* * * * *